(12) United States Patent
Yang et al.

(10) Patent No.: US 10,665,726 B2
(45) Date of Patent: May 26, 2020

(54) MEMORY DEVICE AND OPERATION METHOD THEREOF

(71) Applicant: TAIWAN SEMICONDUCTOR MANUFACTURING CO., LTD., Hsinchu (TW)

(72) Inventors: Tsung-Yu Yang, Tainan (TW); Chung-Jen Huang, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/420,206

(22) Filed: Jan. 31, 2017

(65) Prior Publication Data

US 2018/0151754 A1 May 31, 2018

Related U.S. Application Data

(60) Provisional application No. 62/426,842, filed on Nov. 28, 2016.

(51) Int. Cl.

| | |
|---|---|
| *G11C 16/04* | (2006.01) |
| *H01L 29/792* | (2006.01) |
| *H01L 29/423* | (2006.01) |
| *G11C 16/14* | (2006.01) |
| *G11C 16/10* | (2006.01) |
| *H01L 29/66* | (2006.01) |
| *H01L 21/28* | (2006.01) |

(52) U.S. Cl.
CPC ........ *H01L 29/792* (2013.01); *G11C 16/0466* (2013.01); *G11C 16/10* (2013.01); *G11C 16/14* (2013.01); *H01L 29/40117* (2019.08); *H01L 29/42344* (2013.01); *H01L 29/66833* (2013.01)

(58) Field of Classification Search
CPC ............. H01L 29/792; H01L 27/11568; H01L 29/42344; G11C 16/0466; G11C 16/14
USPC ........................................ 365/185.29, 185.18
See application file for complete search history.

(56) References Cited

U.S. PATENT DOCUMENTS

| | | | | |
|---|---|---|---|---|
| 8,030,165 | B2* | 10/2011 | Chen ................. | H01L 21/28282 257/E21.21 |
| 2004/0084710 | A1* | 5/2004 | Baker, Jr. ........... | G11C 16/0425 257/311 |
| 2005/0128806 | A1* | 6/2005 | Liou .................. | G11C 16/0466 365/185.05 |

(Continued)

*Primary Examiner* — Huan Hoang
(74) *Attorney, Agent, or Firm* — McClure, Qualey & Rodack, LLP

(57) ABSTRACT

A memory device and an operation method thereof are provided. The memory device includes a semiconductor substrate and an oxide-nitride-oxide (ONO) gate structure located on the semiconductor substrate. The ONO gate structure includes a bottom oxide layer, a top oxide layer and a nitride layer. The nitride layer is located between the bottom oxide layer and the top oxide layer. The bottom oxide layer is located closer to the semiconductor substrate than the top oxide layer. The bottom oxide layer has a first thickness, and the top oxide layer has a second thickness smaller the first thickness. The operation method includes an erasing operation and a programming operation. Electrons are attracted into the ONO gate structure through the bottom oxide layer in the programming operation. Electrons trapped in the ONO gate structure escape from the ONO gate structure through the top oxide layer.

20 Claims, 16 Drawing Sheets

(56) References Cited

U.S. PATENT DOCUMENTS

| | | | |
|---|---|---|---|
| 2006/0192241 A1* | 8/2006 | Lee | H01L 27/115 257/314 |
| 2007/0087502 A1* | 4/2007 | Chung-Zen | H01L 27/115 438/257 |
| 2015/0098274 A1* | 4/2015 | Rhie | G11C 16/0483 365/185.17 |
| 2016/0155860 A1* | 6/2016 | Shum | H01L 29/7816 257/326 |

* cited by examiner

200 providing the memory unit — 210 conducting a FN erasing operation to apply a high voltage on the gate control layer, and to apply a ground reference voltage to the semiconductor substrate — 220

MEMORY DEVICE AND OPERATION METHOD THEREOF

RELATED APPLICATION

This application claims the benefit of the Provisional Application Ser. No. 62/426,842, filed Nov. 28, 2016. The entire disclosures of all the above applications are hereby incorporated by reference herein.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Super-flash technology has enabled designers to create cost effective and high performance programmable SOC (system on chip) solutions through the use of split-gate flash memory cells. The aggressive scaling of the embedded flash memory enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
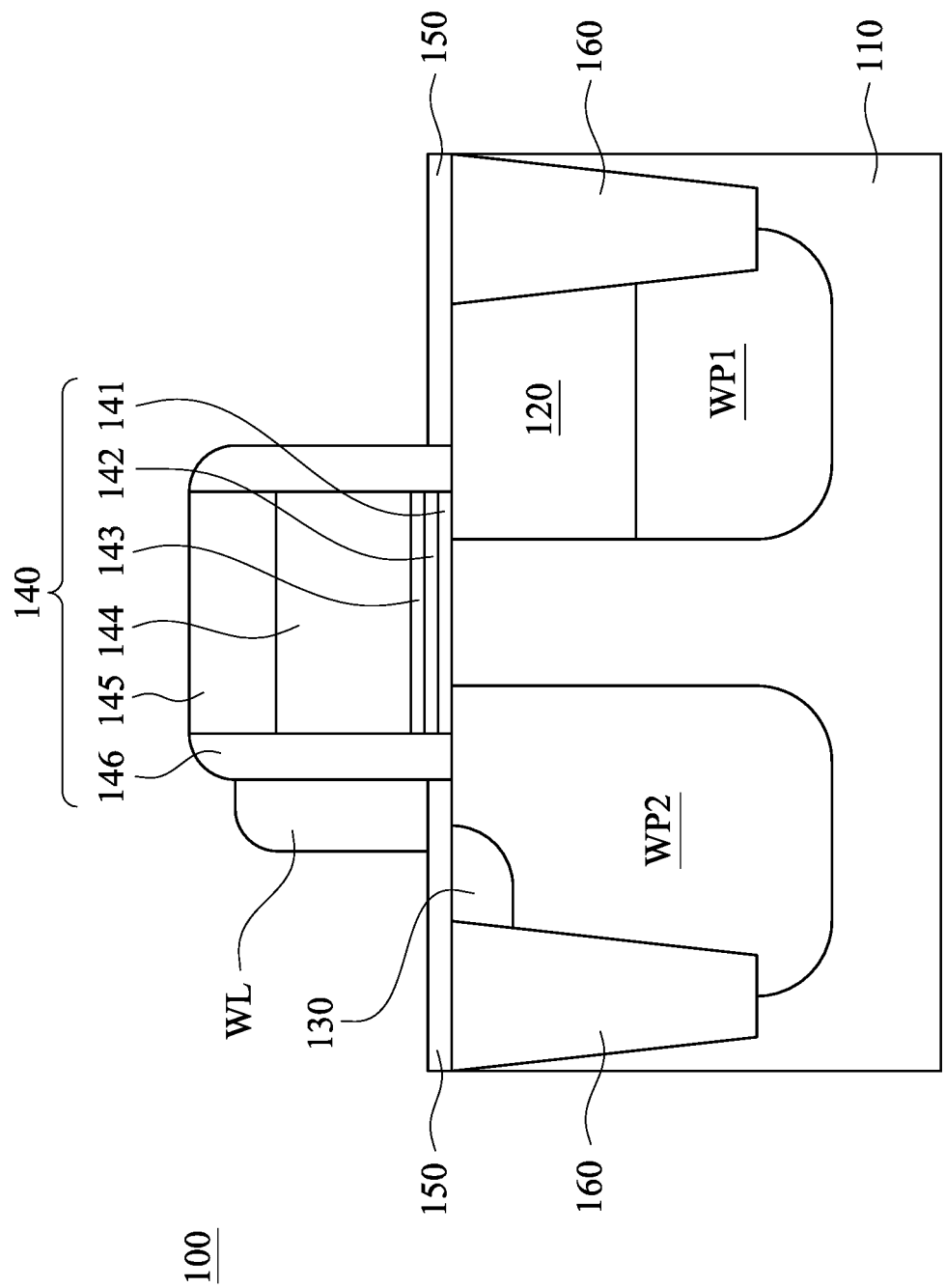
FIG. 1 is a schematic diagram showing a memory unit of a memory device in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Embodiments of the present disclosure are directed to a memory device and an operation method thereof. The memory device includes a semiconductor substrate and an oxide-nitride-oxide (ONO) gate structure located on the semiconductor substrate. The ONO gate structure includes a bottom oxide layer, a top oxide layer and a nitride layer. The nitride layer is located between the bottom oxide layer and the top oxide layer. The bottom oxide layer is located closer to the semiconductor substrate than the top oxide layer. The bottom oxide layer has a first thickness, and the top oxide layer has a second thickness smaller the first thickness. The operation method includes an erasing operation and a programming operation. Electrons are attracted into the ONO gate structure through the bottom oxide layer in the programming operation. Electrons trapped in the ONO gate structure escape from the ONO gate structure through the top oxide layer. Since the electrons respectively pass through different oxide layers (the bottom oxide layer and the top oxide layer) in the programming operation and the erasing operation, the endurance of the memory unit is increased. Since the bottom oxide layer is thicker than the top, the reliability of the memory device can be increased.

Referring to FIG. 1. FIG. 1 is a schematic diagram showing a memory unit 100 of a memory device in accordance with an embodiment of the present disclosure. The memory device includes bit lines (not shown), word lines WL and memory units 100. The bit lines and the word lines WL are located on a substrate 110 and electrically connected to the memory units 100 to control the memory units 100. For example, each of the memory units 100 is electrically connected to a corresponding bit line and a corresponding word line WL, and thus each of the memory units 100 can be controlled to store data by the corresponding bit line and the corresponding word line WL.

As shown in FIG. 1, the memory unit 100 includes the semiconductor substrate 110, a source region 120, a drain region 130, and a gate structure 140. The semiconductor substrate 110 may be a semiconductor material and may include structures including a graded layer or a buried oxide, for example. In some exemplary examples, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the silicon semiconductor substrate 110 may be an active layer of a semiconductor-on-insulator (SOI) substrate or a multi-layered structure such as a silicon-germanium layer formed on a bulk silicon layer.

Well regions WP1 and WP2 are formed in the semiconductor substrate 110, and the source region 120 and the drain region 130 are formed in the well regions WP1 and WP2 respectively, in which the drain region 130 is configured to be electrically connected to a bit line corresponding to the memory unit 100. For example, the drain region 130 can be a junction of the memory unit 100 used to be electrically connected to the corresponding bit line. The formation of the well regions WP1 and WP2 can be conducted by using an implantation process. The implantation process may be conducted by using dopants, such as boron and phosphorous. Similarly, the formation of source region 120 and the drain region 130 can be conducted by using an implantation process and the implantation process may be conducted by using dopants, such as boron and phosphorous. In some exemplary examples, the word line WL can be formed form polysilicon.

The gate structure 140 is located between the source region 120 and the drain region 130. The gate structure 140 is an ONO gate structure configured to provide a trapping storage function to store data. The gate structure 140 includes a bottom oxide layer 141, a nitride layer 142, a top oxide layer 143 and a gate control layer 144. The bottom oxide layer 141 is located closer to the semiconductor substrate 110 than the top oxide layer 143. For example, the bottom oxide layer 141 contacts the semiconductor substrate 110, and the nitride layer 142 is located between the bottom oxide layer 141 and the top oxide layer 143, and thus the bottom oxide layer 141 is located closer to the semiconductor substrate 110 than the top oxide layer 143. The ONO gate structure is configured to trap electrons. For example, when a voltage difference is applied to the ONO gate structure, the electrons are attracted into the ONO gate structure via the bottom oxide layer 141, and then trapped in the ONO gate structure. In this embodiment, the top oxide layer 143 and the bottom oxide layer 141 are formed from silicon oxide, and the nitride layer is formed firm silicon nitride, but embodiments of the present disclosure are not limited thereto.

Further, the top oxide layer 143 has a thickness smaller than a thickness of the bottom oxide layer 141. In this embodiment, the thickness of the bottom oxide layer 141 is in a range from about 30 angstrom to about 100 angstrom, the thickness of the top oxide layer 143 is in a range from about 15 angstrom to about 50 angstrom, and a thickness of the nitride layer 142 is in a range from about 70 angstrom to about 150 angstrom. However, embodiments of the present disclosure are not limited thereto. In some exemplary examples, a thickness of the top oxide layer 143 is 2-7 times of the thickness of the bottom oxide layer 141.

The gate control layer 144 is located on the top oxide layer 143 to form a stacked structure together with the bottom oxide layer 141, the nitride layer 142, and the top oxide layer 143. The gate control layer 144 is configured to receive a control signal to control the operation of the gate structure 140. For example, the control signal is applied to the gate control layer 144 to erase or program the memory unit 100. In this embodiment, the gate control layer 144 is formed by using a deposition method, such as a chemical vapor deposition method, and the gate control layer 144 may be formed from polysilicon. However, embodiments of the present disclosure are not limited thereto.

The gate structure 140 may further include a passivation layer 145 and spacers 146. The passivation layer 145 is located on the gate control layer 144 and the spacers 146 are located on sidewalls of the bottom oxide layer 141, the nitride layer 142, the top oxide layer 143 and the gate control layer 144, thereby protecting the gate structure 140. In this embodiment, the passivation layer 145 is formed from silicon nitride and silicide oxide(NO) and the spacers 146 is formed from silicon oxide, silicon nitride and silicon oxide (ONO), but embodiments of the present disclosure are not limited thereto.

The memory unit 100 further includes a gate dielectric layer 150 formed on the well regions WP1 and WP2, and a word line WL corresponding to the memory unit 100 is located on the gate dielectric layer 150. In this embodiment, the word line WL is located between the drain region 130 and the gate structure 140 to form an I/O gate or a core gate structure together with the gate dielectric layer 150 under the word line WL. In this embodiment, the gate dielectric layer 150 is formed from silicon oxide by using a thermal oxidation method, but embodiments of the present disclosure are no limited thereto.

In addition, the memory unit 100 may include various isolation structures 160. In some exemplary examples, in the formation of the isolation structures 160, a hard mask (not shown) is formed to cover the semiconductor substrate 110, the hard mask is then patterned by a photolithography process and an etch process, and portions of the substrate 110, which are not covered by the patterned hard mask, are removed to form various trenches in the semiconductor substrate 110, an isolation material is formed to fill the trenches and to cover the hard mask layer, and then the hard mask and the isolation material over the hard mask layer are removed to form the isolation structures 160 in the semiconductor substrate 110. In this embodiment, the isolation structures 160 are shallow trench isolation (STI) structures. The isolation material may be formed by using a high density plasma chemical vapor deposition (HDP CVD) method.

It can be understood that the memory unit 100 is a 1.5 T split-gate memory device, and the thickness of the top oxide layer 143 of the gate structure 140 is smaller than the thickness of the bottom oxide layer 141 of the gate structure 140. The arrangement of thickness decreases damage risk caused by operation of the memory unit 100, thereby improving endurance of the memory unit 100.

Figures 2, 3:
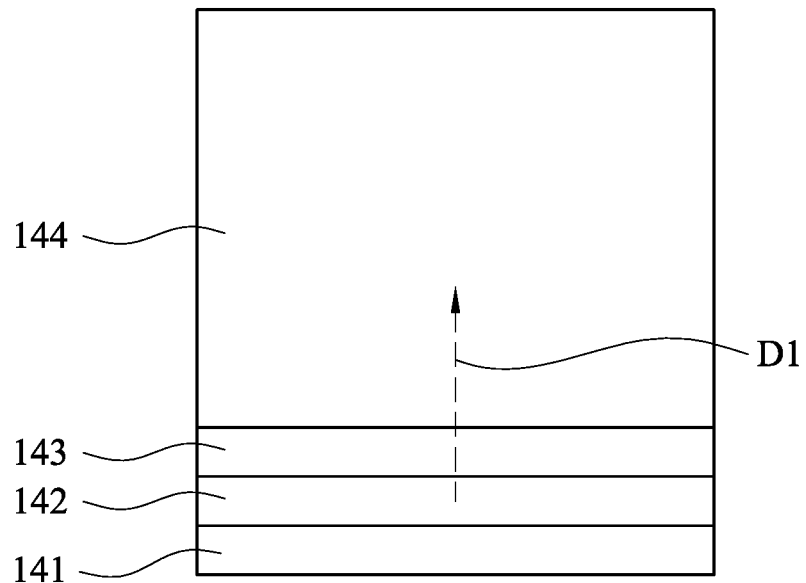
FIG. 2 is a flow chart showing an operation method of a memory unit in accordance with an embodiment of the present disclosure.
FIG. 3 is an enlarged diagram showing a portion of a gate structure of a memory unit in accordance with an embodiment of the present disclosure.

Referring to FIG. 2, FIG. 2 is a flow chart showing an operation method 200 of the memory unit 100 in accordance with an embodiment of the present disclosure. The operation method 200 begins at operation 210. In the operation 210, the memory unit 100 is provided. Then, operation 220 is conducted to conduct an erasing operation. The erasing operation is configured to erase data stored in the memory unit 100. In the operation 220, a voltage difference is applied to the gate structure 140 to remove electrons trapped in the gate structure 140. In this embodiment, a high voltage is applied to the gate control layer 144, and a low voltage, such as a ground reference voltage is applied to the semiconductor substrate 110, thereby forming a voltage difference on the ONO structure (including the bottom oxide layer 141, the nitride layer 142 and the top oxide layer 143). Therefore, a voltage at the bottom oxide layer 141 is lower than a voltage at the top oxide layer 143, and the electrons trapped in the ONO structure escape from the ONO structure through the top oxide layer 143 (along direction DO, as shown in FIG. 3. In this embodiment, the erase operation is conducted by a Fowler-Nordheim (FN) erase method.

Figure 4:
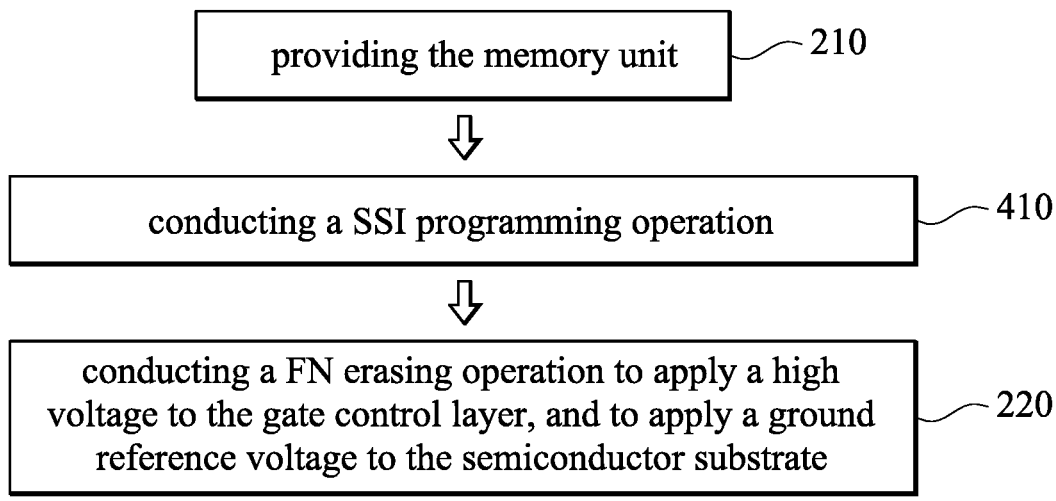
FIG. 4 is a flow chart showing an operation method of a memory unit in accordance with an embodiment of the present disclosure.
Figure 5:
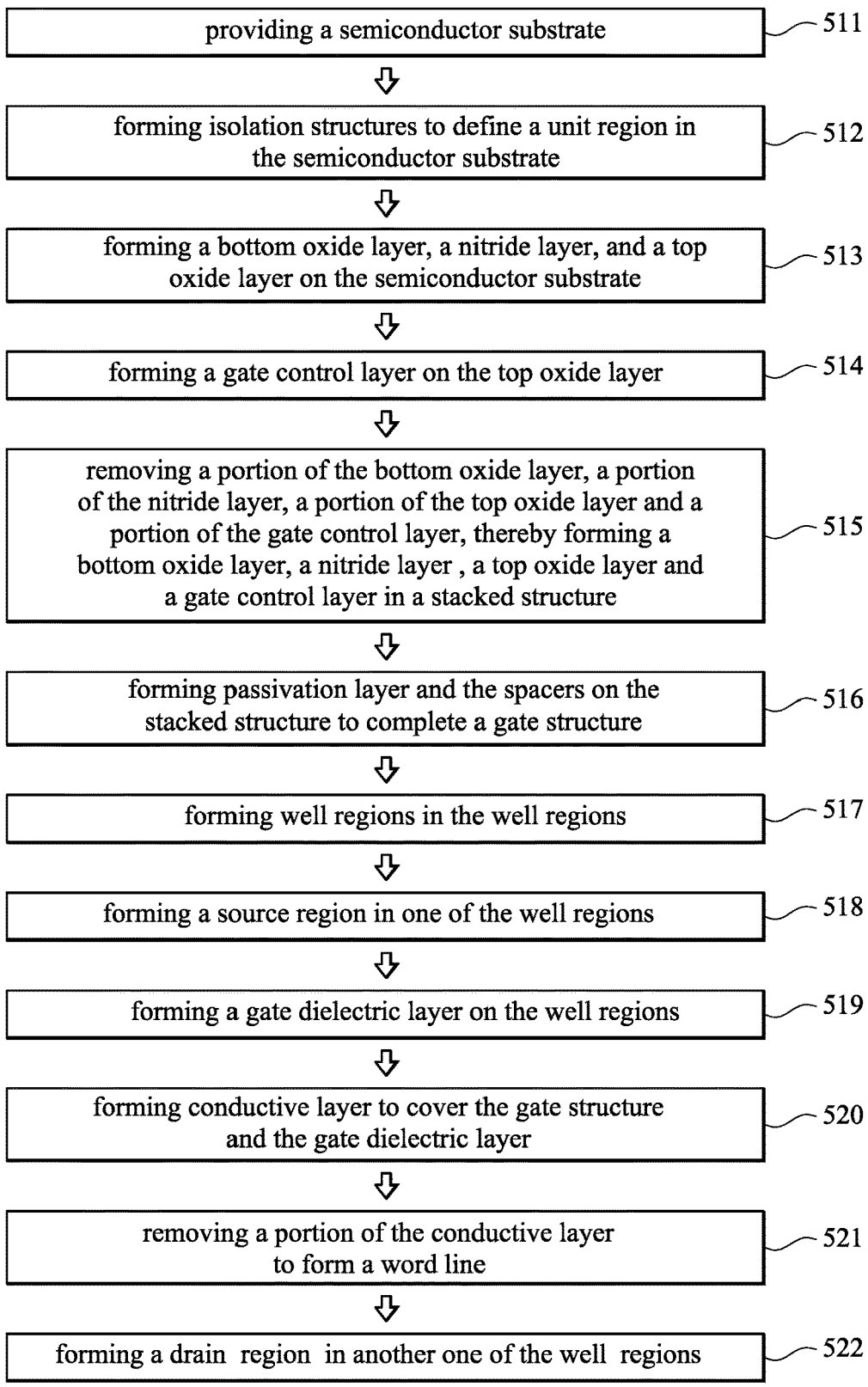
FIG. 5 is a flow chart of a method for manufacturing a memory unit in accordance with an embodiment of the present disclosure.

Referring to FIG. 4, FIG. 4 is a flow chart showing an operation method 400 of the memory unit 100 in accordance with an embodiment of the present disclosure. The method begins at operation 210. In the operation 210, the memory unit 100 is provided. Then, operation 410 is conducted to conduct a programming operation. The programming operation is configured to program the memory unit 100. In the operation 410, a high voltage is applied to the gate control layer 144 and source region 120 and a low voltage such as the ground reference voltage is applied to the semiconductor substrate 110. Thus, electrons in an induced channel under the gate structure 140 are attracted to the ONO structure through the bottom oxide layer 141 and trapped in the ONO structure. In this embodiment, the operation 410 is conducted by a source side injection (SSI) method. After the operation 410, the operation 220 is conducted to erase data stored in the memory unit 100.

It can be understood that the operation method 400 includes the operation 220 to erase data stored in the memory unit 100 and the operation 410 to program the memory unit 100. In the operation 410 for programming the memory unit 100, the electrons enter the ONO structure through the bottom oxide layer 141. In the operation 220 for erasing the memory unit 100, the electrons escape from the ONO structure through the top oxide layer 143. Since the electrons pass through different oxide layers (the bottom oxide layer 141 and the top oxide layer 143) in the operation 220 and the operation 410, the bottom oxide layer 141 is stressed only in the operation 410, and the top oxide layer 143 is stressed only in the operation 220.

Therefore, different oxide layers are stressed in the operation 220 to erase data stored in the memory unit 100 and the operation 410 to program the memory unit 100, and the endurance of the memory unit can be increased accordingly.

Referring to FIG. 5 and FIG. 6 to FIG. 17, FIG. 5 is a flow chart of a method 500 for manufacturing the memory unit 100 in accordance with an embodiment of the present disclosure, and FIG. 6 to FIG. 17 are schematic cross-sectional views of intermediate stages showing the method 500 for manufacturing the memory unit 100 in accordance with an embodiment of the present disclosure.

Figure 6:
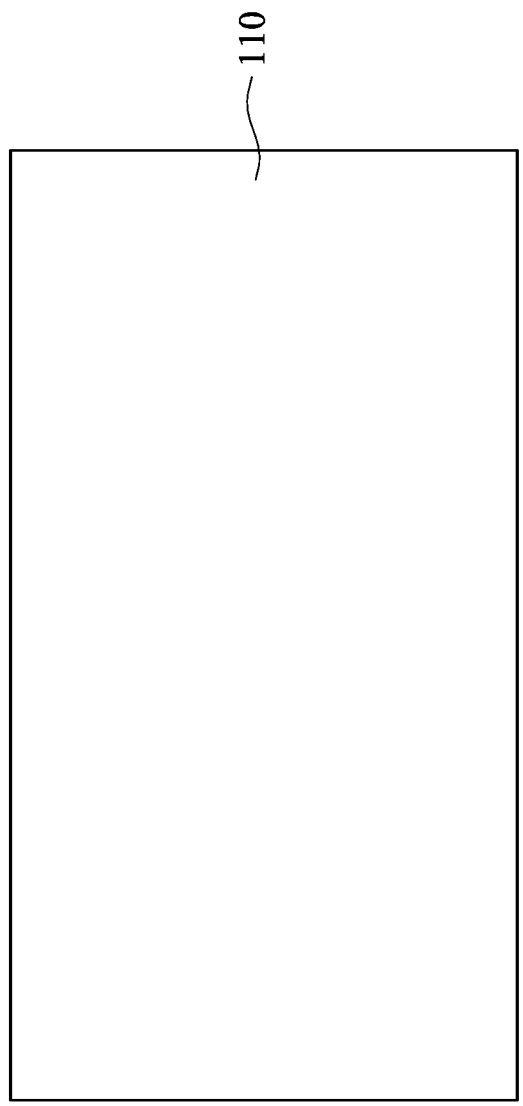
FIG. 6 to FIG. 17 are schematic cross-sectional views of intermediate stages showing the method for manufacturing a memory unit in accordance with an embodiment of the present disclosure.

The method 500 begins at operation 511. In the operation 511, the semiconductor substrate 110 is provided, as shown in FIG. 6. The semiconductor substrate 110 may be a semiconductor material and may include structures including a graded layer or a buried oxide, for example. In some exemplary examples, the semiconductor substrate 110 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the semiconductor substrate 110. Alternatively, the silicon semiconductor substrate 110 may be an active layer of a semiconductor-on-insulator (SOI) substrate or a multi-layered structure such as a silicon-germanium layer formed on a bulk silicon layer.

Figure 7:
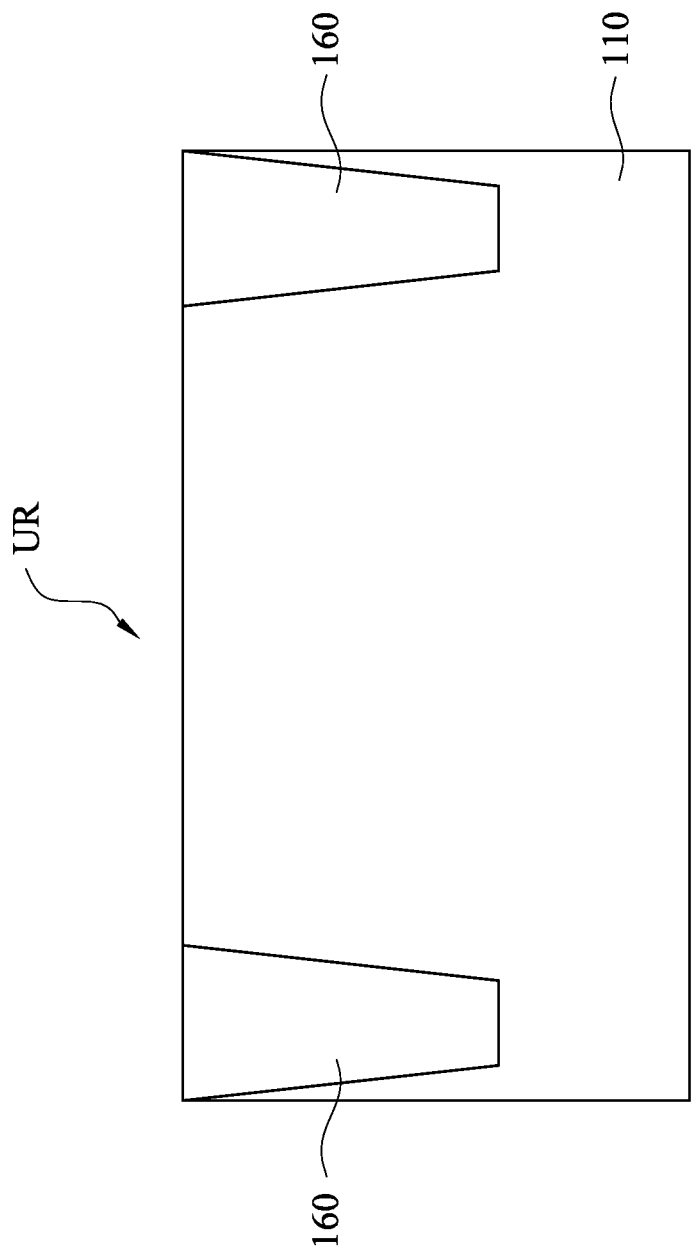

Then, operation 512 is conducted. In the operation 512, the isolation structures 160 are formed to define a unit region UR in the semiconductor substrate 110, as shown in FIG. 7. In some exemplary examples, in the formation of the isolation structures 160, a hard mask (not shown) is formed to cover the semiconductor substrate 110, the hard mask is then patterned by a photolithography process and an etch process, and portions of the substrate 110, which are not covered by the patterned hard mask, are removed to form various trenches in the semiconductor substrate 110, an isolation material is formed to fill the trenches and to cover the hard mask layer, and then the hard mask and the isolation material over the hard mask layer are removed to form the isolation structures 160 in the semiconductor substrate 110. In this embodiment, the isolation structures 160 are shallow trench isolation (STI) structures. The isolation material may be formed by using a high density plasma chemical vapor deposition (HDP CVD) method.

Figure 8:
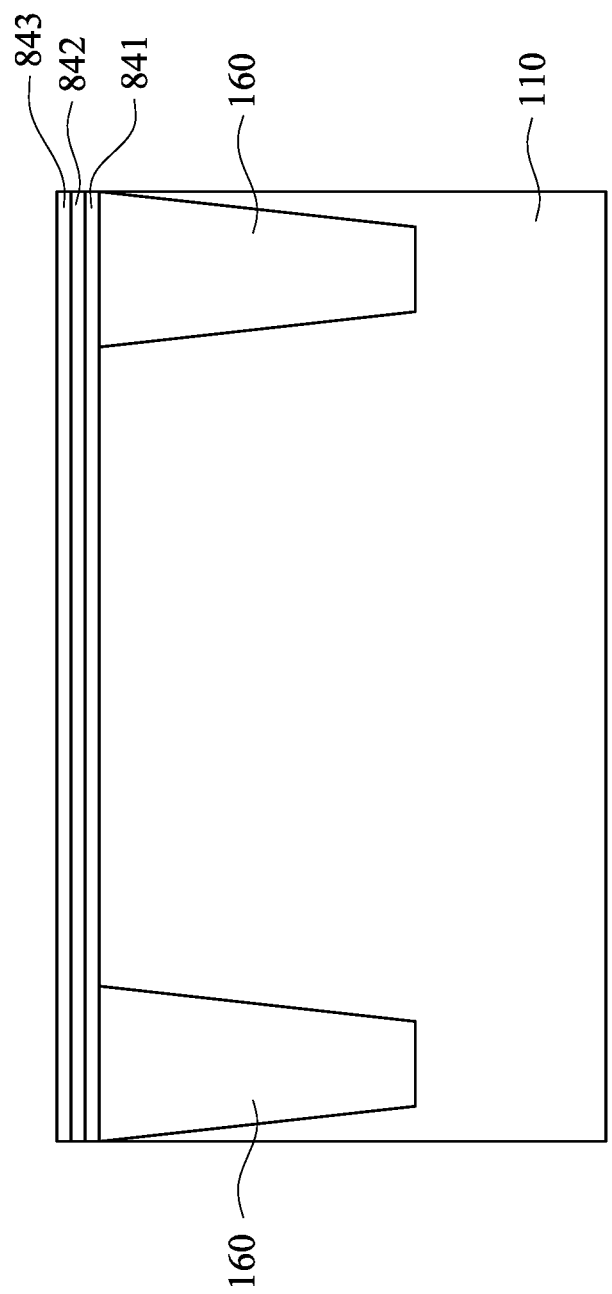

Thereafter, operation 513 is conducted to form a bottom oxide layer 841, a nitride layer 842, and a top oxide layer 843 on the semiconductor substrate 110 in sequence to form an ONO structure, as shown in FIG. 8. In some exemplary examples, the bottom oxide layer 841, the nitride layer 842, and the top oxide layer 843 can be formed by using a deposition method or a growth method, such as a chemical vapor deposition (CVD) method. The bottom oxide layer 841 and the top oxide layer 843 may be formed from silicon oxide, and the nitride layer 842 may be formed from silicon nitride. The top oxide layer 843 has a thickness smaller than a thickness of the bottom oxide layer 841. In this embodiment, the thickness of the bottom oxide layer 841 is in a range from about 30 angstrom to about 100 angstrom, the thickness of the top oxide layer 843 is in a range from about 15 angstrom to about 50 angstrom, and a thickness of the nitride layer 842 is in a range from about 70 angstrom to about 150 angstrom. However, embodiments of the present disclosure are not limited thereto. In some exemplary examples, a thickness of the top oxide layer 843 is 2-7 times of the thickness of the bottom oxide layer 841.

Figure 9:
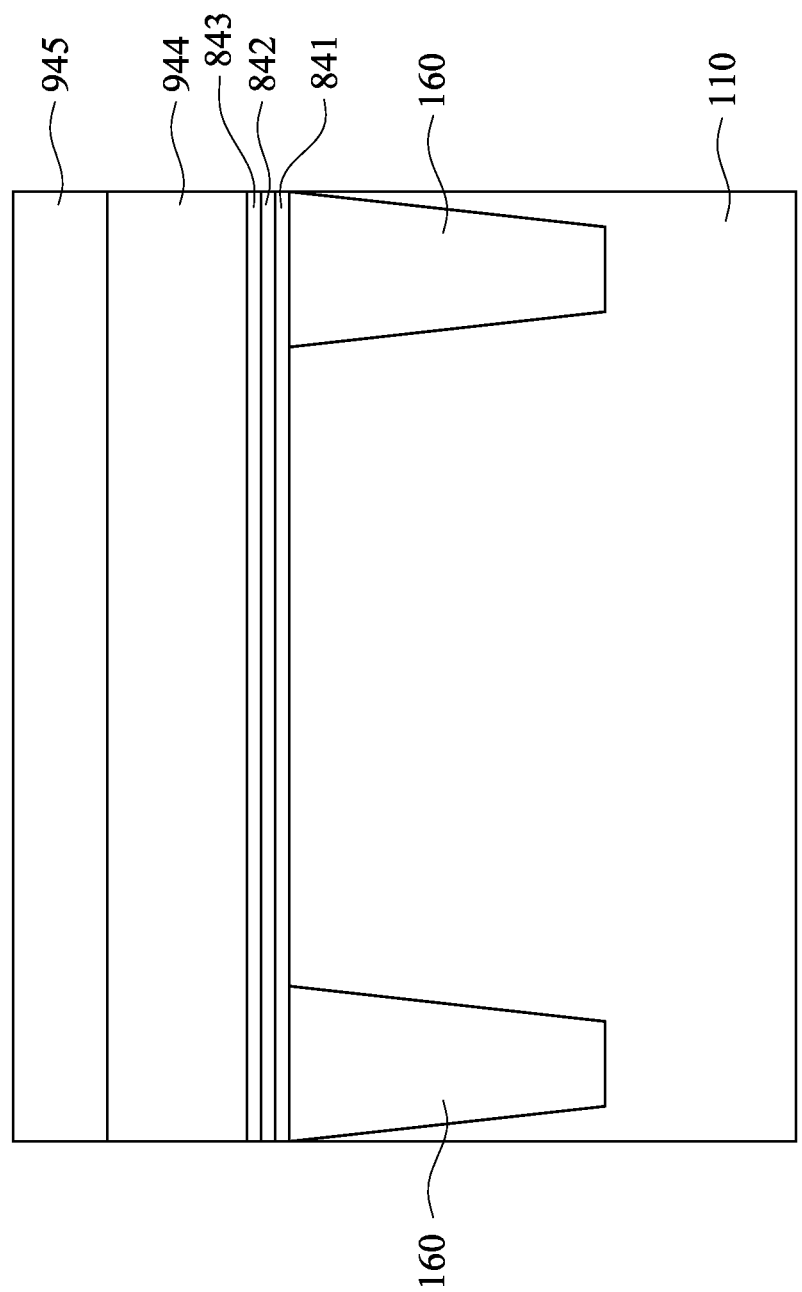

Then, operation 514 is conducted to form a gate control layer 944 on the top oxide layer 843, and a passivation layer 945 on the top of gate control layer 944 as shown in FIG. 9. In some exemplary examples, the formation of the gate control layer 944 can be conducted by using a deposition method, such as a chemical vapor deposition method. The gate control layer 944 may be formed from polysilicon and the passivation layer 945 may be formed from silicon nitride and silicon oxide(NO). In some exemplary examples, the gate control layer 944 is directly deposed on the top oxide layer 843.

Figure 10:
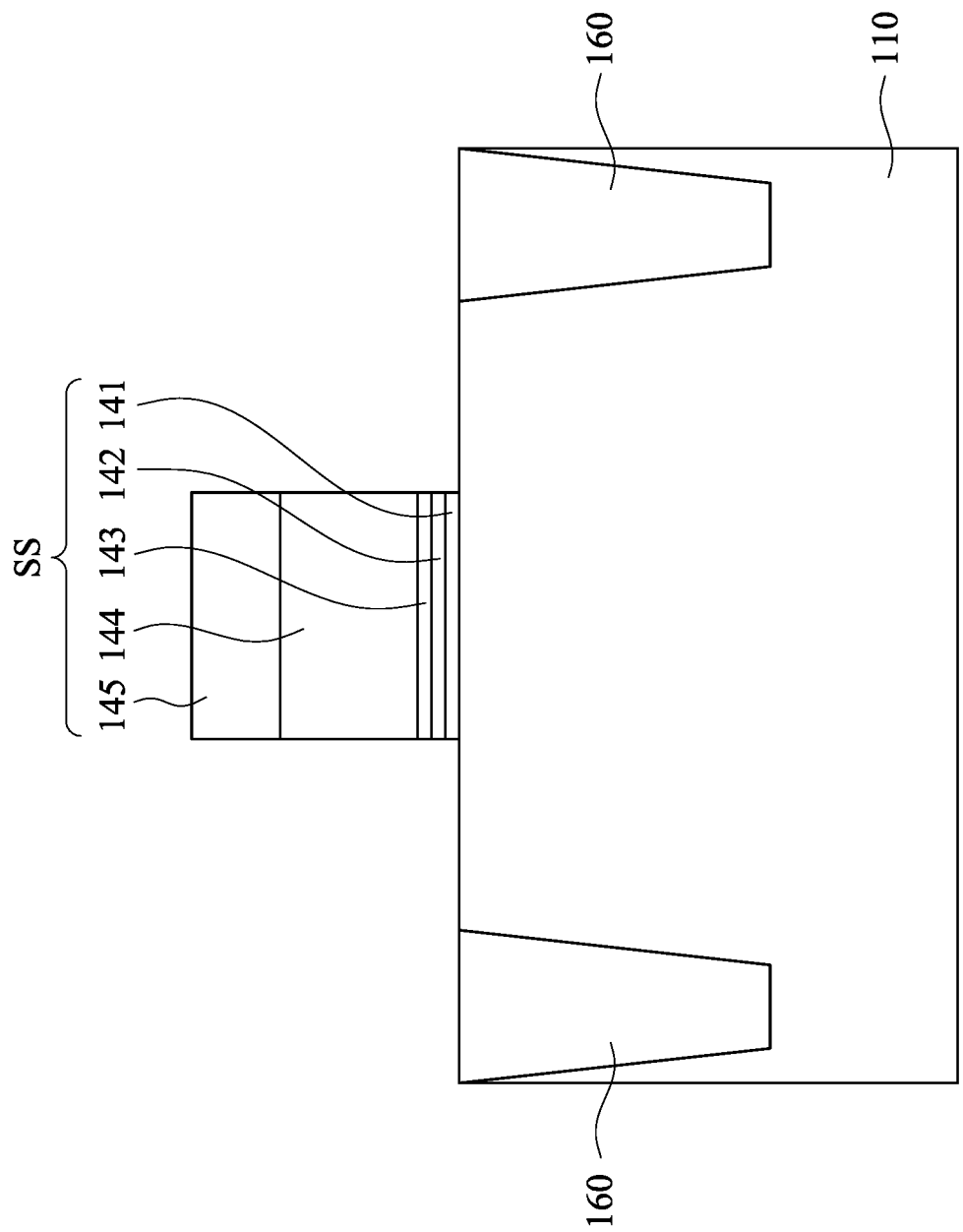

Thereafter, operation 515 is conducted to remove a portion of the bottom oxide layer 841, a portion of the nitride layer 842, a portion of the top oxide layer 843, a portion of the gate control layer 944 and a portion of passivation layer 945, thereby forming the bottom oxide layer 141, the nitride layer 142, the top oxide layer 143, the gate control layer 144 and the passivation layer 145 in a stacked structure SS on the unit region UR, as shown in FIG. 10. In some exemplary examples, the operation 515 can be conducted by using a photolithography method and an etching method.

Figure 11:
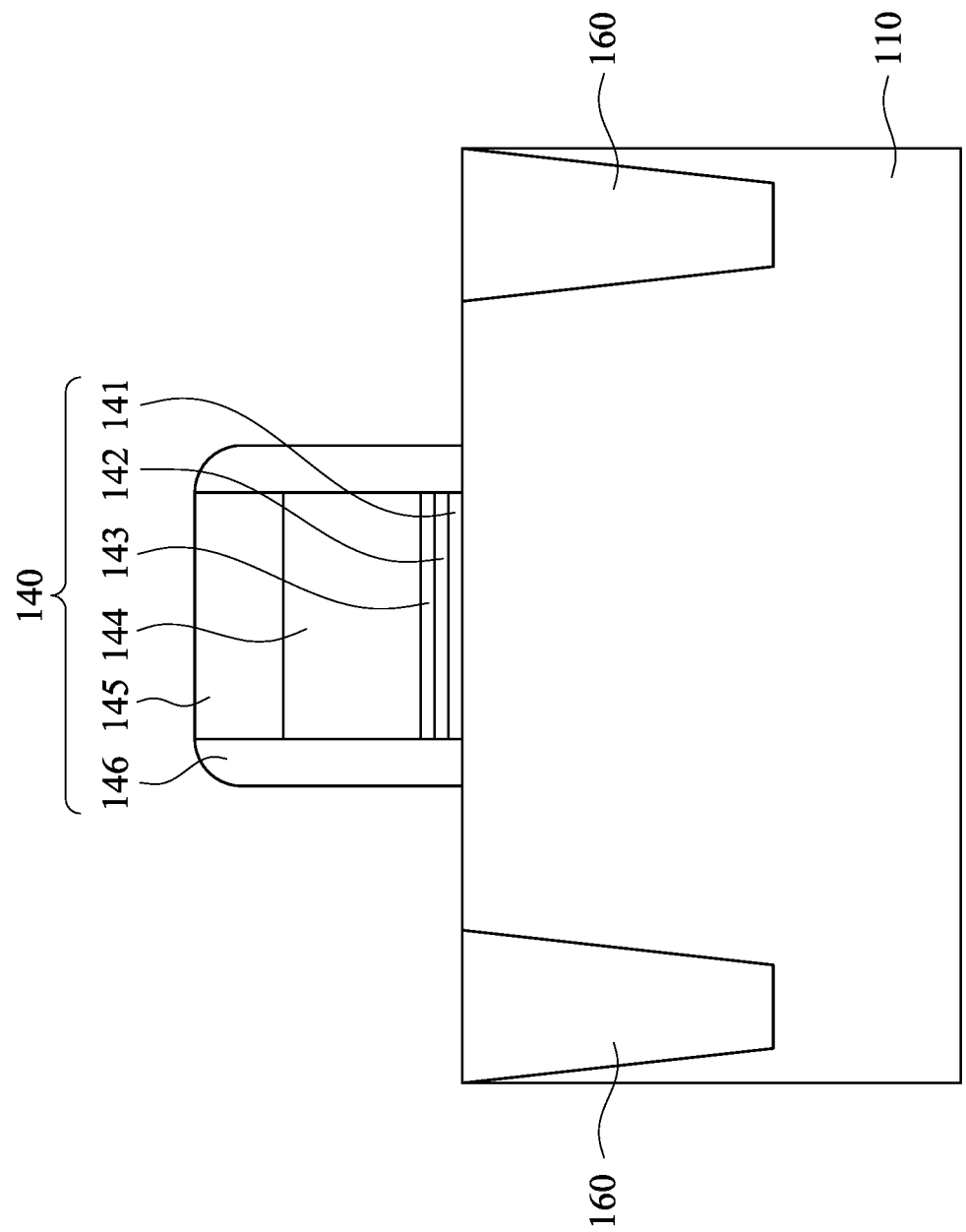

Then, operation 516 is conducted to form the spacers 146 on the stacked structure SS to complete the gate structure 140, as shown in FIG. 11. In some exemplary examples, the operation 516 includes blanketly forming an oxide, nitride and oxide layer to cover the stacked structure SS, and etching the oxide, nitride and oxide layer to remove a portion of the oxide, nitride and oxide layer, so as to form the spacers 146 on the sidewalls of the stacked structure SS.

Figure 12:
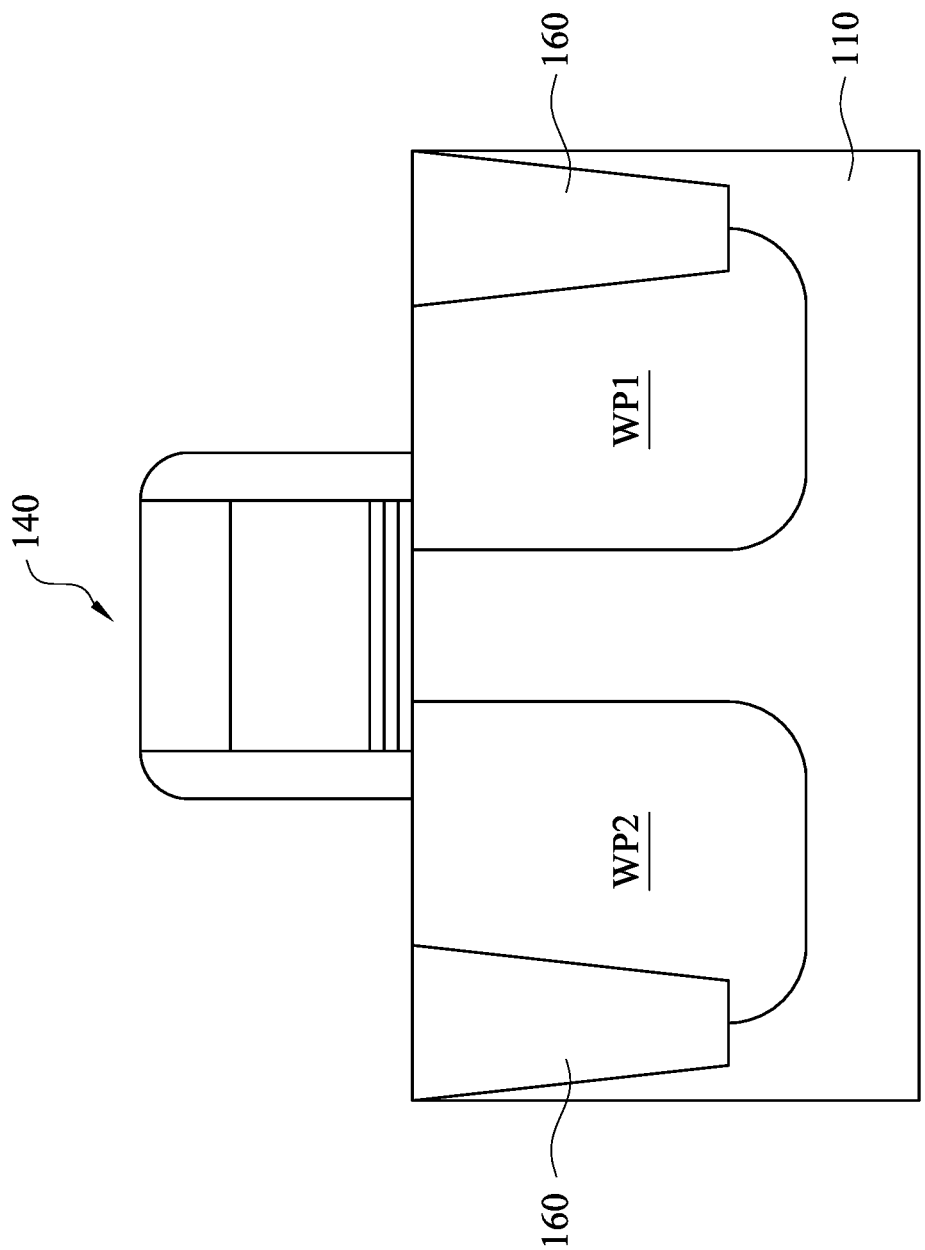

Thereafter, operation 517 is conducted to form the well regions WP 1 and WP2, as shown in FIG. 12. In some exemplary examples, the operation 517 can be conducted by using an implantation process, so as to form the well regions WP1 and WP2. The well regions WP1 and WP2 are respectively adjacent to the gate structure 140, and thus the gate structure 140 is located between the well regions WP1 and WP2. The implantation process may be conducted by using dopants, such as boron and phosphorous. A mask layer can be optionally used in the operation 517 to protect other devices. The mask layer is formed from a photoresist material, and the mask layer may be formed by using a spin-coating process and a photolithography process.

Figure 13:
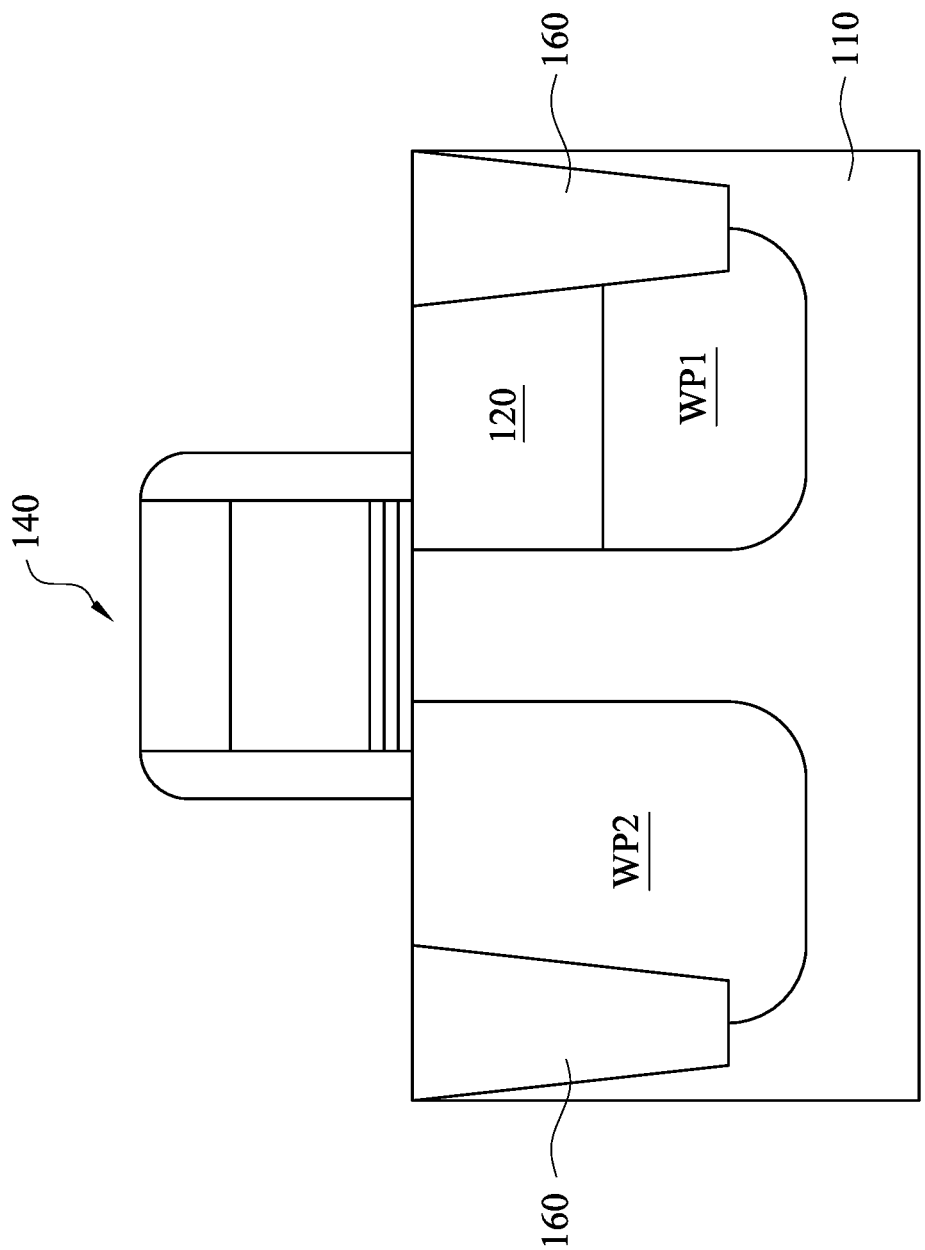

Then, operation 518 is conducted to form the source region 120 in the well region WP1, as shown in FIG. 13. In some exemplary examples, the operation 518 can be conducted by implantation processes.

Figure 14:
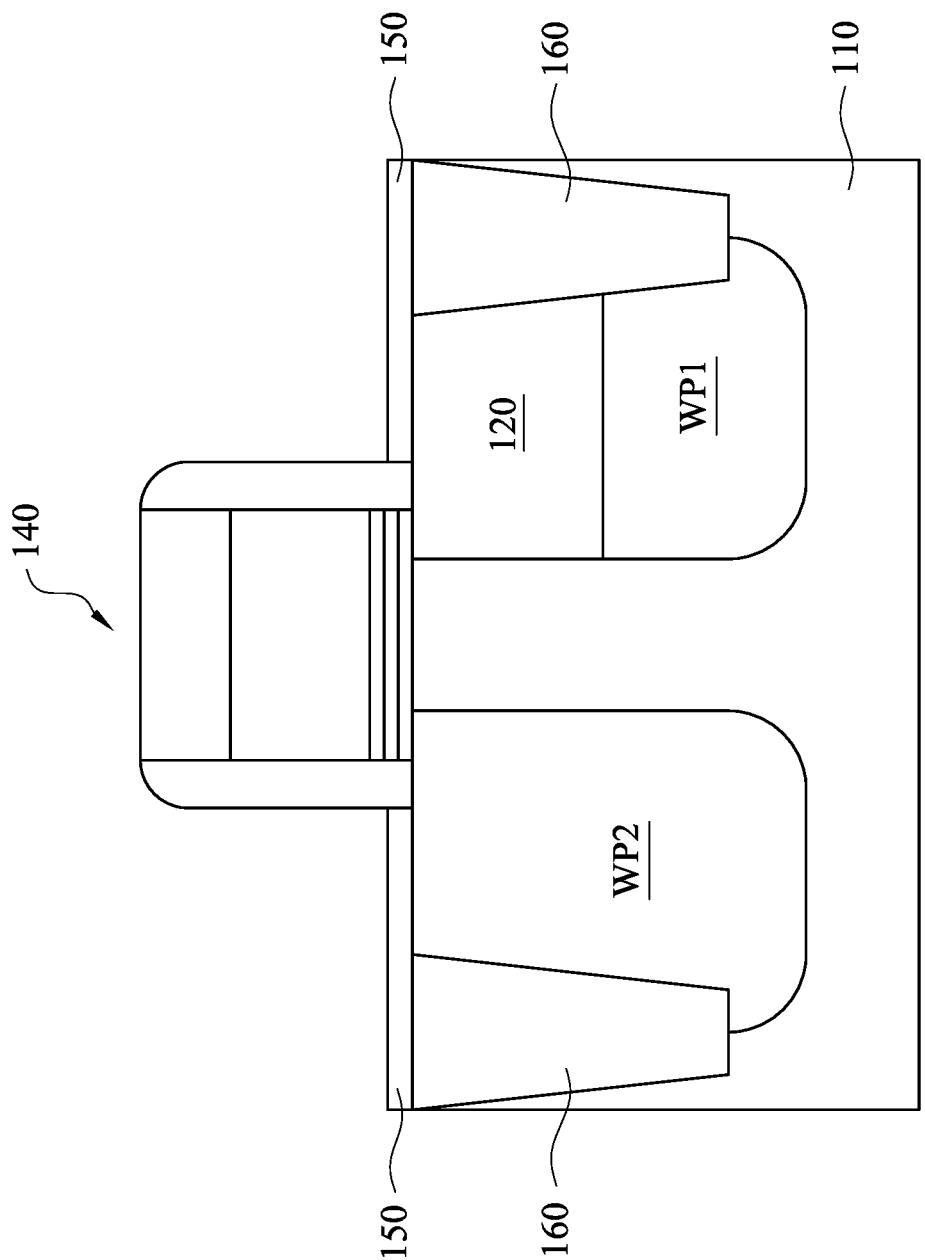

Thereafter, operation 519 is conducted to form a gate dielectric layer 150 on the well regions WP1 and WP2, as shown in FIG. 14. In some exemplary examples, gate dielectric layer 150 can be formed to include a rapid thermal oxide layer and a high temperature oxide layer on the rapid thermal oxide layer. A rapid thermal annealing process may be optionally performed on the gate dielectric layer 150.

Figure 15:
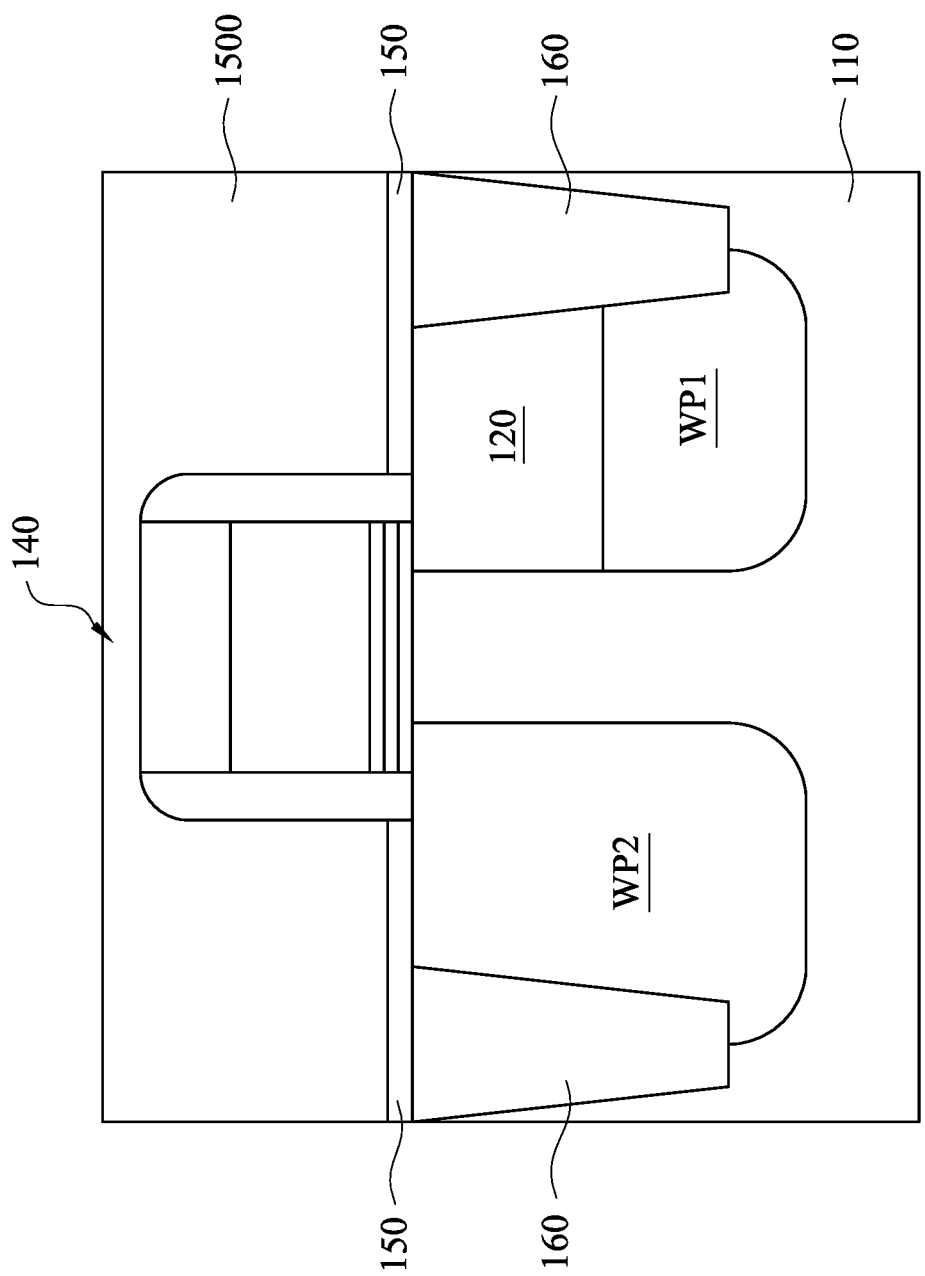

Then, operation 520 is conducted to form a conductive layer 1500 covering the gate structure 140 and the gate dielectric layer 150, as shown in FIG. 15. In some exemplary examples, the conductive layer 1500 can be formed from polysilicon, and may be formed by using a deposition method, such as a chemical vapor deposition method.

Figure 16:
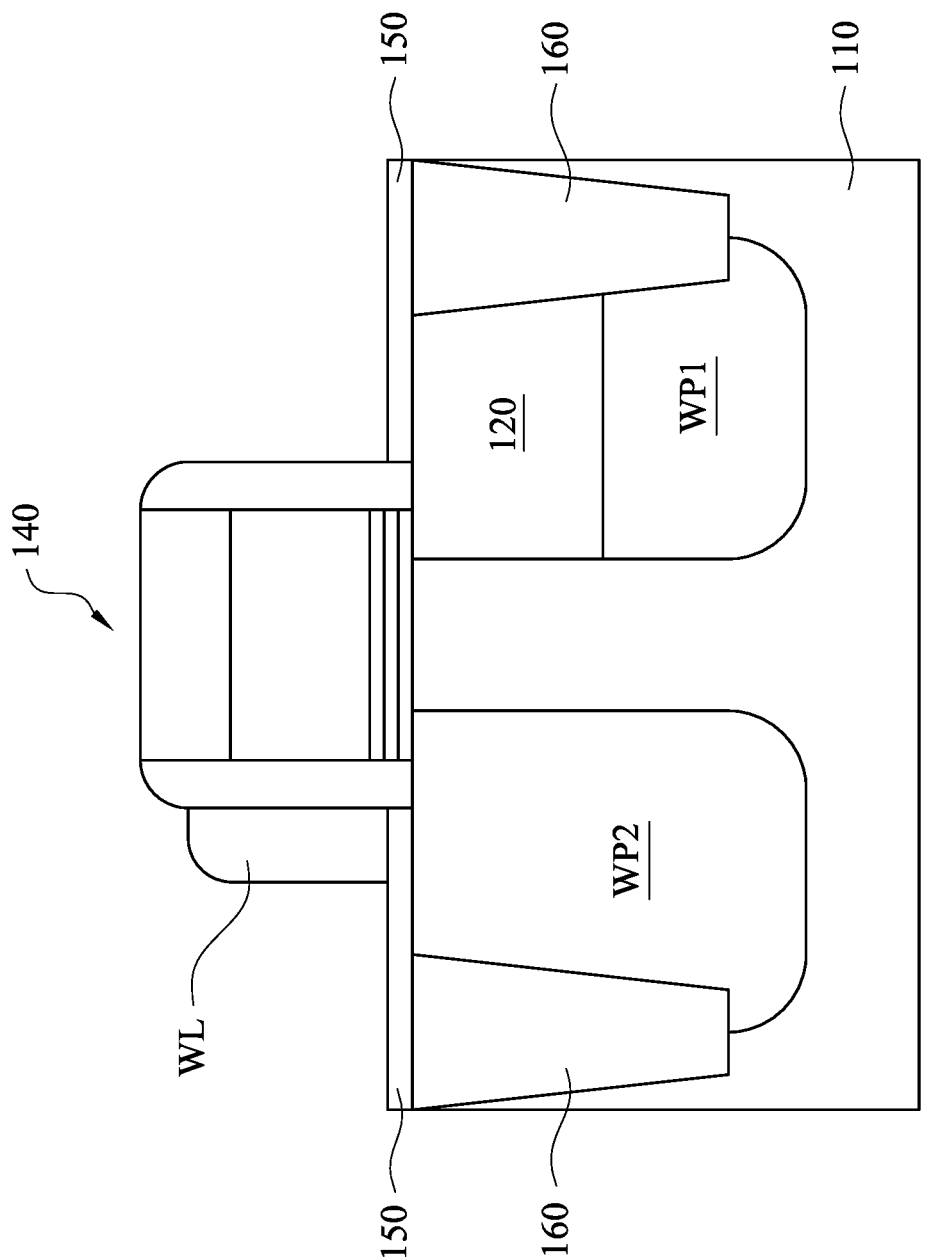

Thereafter, operation 521 is conducted to remove a portion of the conductive layer 1500 to form the word line WL, as shown in FIG. 16. In some exemplary examples, the operation 521 can be conducted by using a photolithography method and an etching method.

Figure 17:
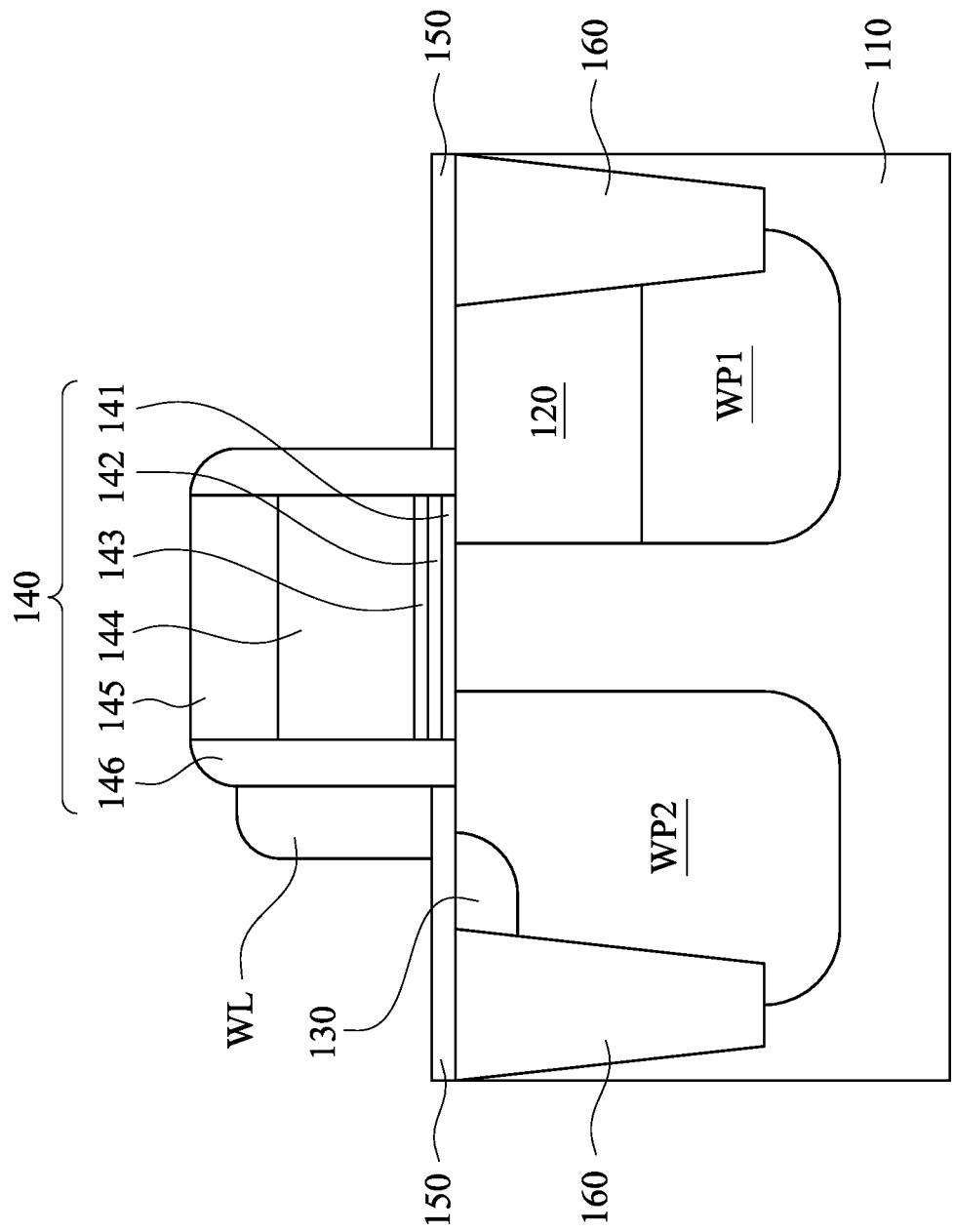

Then, operation 522 is conducted to form the drains region 130 in the well region WP2, as shown in FIG. 17. In some exemplary examples, operation 522 can be conducted by implantation processes.

It can be understood that the method 500 provides the bottom oxide layer 841 with a greater thickness and provides the top oxide layer 843 with a smaller thickness. The bottom oxide layer 841 and the top oxide layer 843 are then etched to form the bottom oxide layer 141 having a greater thickness and the top oxide layer 143 having a smaller thickness, thereby forming the ONO gate structure 140.

Embodiments of the present disclosure are directed to a memory device and an operation method thereof. The memory device includes a semiconductor substrate and an oxide-nitride-oxide gate structure located on the semiconductor substrate. The ONO gate structure includes a bottom oxide layer, a top oxide layer and a nitride layer. The nitride layer is located between the bottom oxide layer and the top oxide layer. The bottom oxide layer is located closer to the semiconductor substrate than the top oxide layer. The bottom oxide layer has a first thickness, and the top oxide layer has a second thickness smaller than the first thickness. The operation method includes an erasing operation and a programming operation. In some exemplary examples, a source side injection (SSI) method is used to program the memory unit to let the hot carrier tunneling through the bottom oxide layer. Further, a Fowler-Nordheim (FN) erase method is used to erase the memory unit to let electrons inject to a side of the gate structure instead of a side of the substrate. Therefore, the bottom oxide layer is stressed only in the programming operation, and the top oxide layer is stressed only in the erasing operation, and the endurance of the memory unit can be increased accordingly.

In accordance with an embodiment of the present disclosure, the present disclosure discloses a semiconductor device. The semiconductor device includes a semiconductor substrate and an oxide-nitride-oxide (ONO) gate structure located on the semiconductor substrate. The ONO gate structure includes a bottom oxide layer, a top oxide layer and a nitride layer. The nitride layer is located between the bottom oxide layer and the top oxide layer. The bottom oxide layer is located closer to the semiconductor substrate than the top oxide layer, and the bottom oxide layer has a first thickness, and the top oxide layer has a second thickness smaller than the first thickness.

In accordance with another embodiment of the present disclosure, the present disclosure discloses a memory device. The memory device includes a plurality of word lines and a plurality of memory units. Each of the memory units includes a semiconductor substrate, a source region, a drain region and an ONO gate structure located between the source region and the drain region. The source region and the drain region are formed in the semiconductor substrate. The ONO gate structure includes a bottom oxide layer, a top oxide layer and a nitride layer. The nitride layer is located between the bottom oxide layer and the top oxide layer. The bottom oxide layer is located closer to the semiconductor substrate than the top oxide layer, and the bottom oxide layer has a first thickness, and the top oxide layer has a second thickness smaller than the first thickness. The word lines are electrically connected to the memory units and located on the substrate.

In accordance with another embodiment of the present disclosure, the present disclosure discloses operation method of a memory device. In the operation method of a memory device, at first, the memory device is provided, in which the memory device includes at least one memory unit, and the at least one memory unit includes a semiconductor substrate, a source region, a drain region and an ONO gate structure. The ONO gate structure includes a bottom oxide layer, a top oxide layer and a nitride layer. The nitride layer is located between the bottom oxide layer and the top oxide layer. The bottom oxide layer is located closer to the semiconductor substrate than the top oxide layer, and the bottom oxide layer has a first thickness, and the top oxide layer has a second thickness smaller than the first thickness. Then, an erasing operation is conducted to erase data stored in the at least one memory unit, in which the erasing operation includes applying a voltage difference to the ONO gate structure, and a voltage at the bottom oxide layer is lower than a voltage at the top oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
   a semiconductor substrate;
   an oxide-nitride-oxide (ONO) gate structure located on the semiconductor substrate, wherein the ONO gate structure comprises:
      a bottom oxide layer;
      a top oxide layer;
      a gate control layer located on the top oxide layer; and
      a nitride layer located between the bottom oxide layer and the top oxide layer;
   wherein the bottom oxide layer is located closer to the semiconductor substrate than the top oxide layer, and the bottom oxide layer has a first thickness, and the top oxide layer has a second thickness smaller than the first thickness, and the top oxide layer of the ONO gate structure is configured to be stressed only during an erase operation;
a spacer disposed on at least one of a sidewall of the top oxide layer, a sidewall of the bottom oxide layer, and a sidewall of the nitride layer, wherein the spacer has an inner sidewall facing the ONO gate structure and an outer sidewall facing away from the ONO gate structure; and
a word line in contact with the outer sidewall of the spacer.

2. The semiconductor device of claim 1, wherein the nitride layer is formed firm silicon nitride.

3. The semiconductor device of claim 1, wherein the top oxide layer and the bottom oxide layer are formed from silicon oxide.

4. The semiconductor device of claim 1, wherein the first thickness of the bottom oxide layer is 2-7 times of the second thickness of the top oxide layer.

5. The semiconductor device of claim 1, wherein the first thickness of the bottom oxide layer is in a range from 30 angstroms to 100 angstroms, and the second thickness of the top oxide layer is in a range from 15 angstrom to 50 angstroms.

6. The semiconductor device of claim 1, wherein a thickness of the nitride layer is in a range from 70 angstroms to 150 angstroms.

7. The semiconductor device of claim 1, wherein the gate control layer is formed from polysilicon.

8. The semiconductor device of claim 1, wherein the spacer is in contact with the sidewall of the top oxide layer, the sidewall of the bottom oxide layer, and the sidewall of the nitride layer.

9. A memory device, comprising:
a plurality of memory units, wherein each of the memory units comprises:
a semiconductor substrate;
a source region formed in the semiconductor substrate;
a drain region formed in the semiconductor substrate; and
an ONO gate structure located between the source region and the drain region, wherein a lateral distance between the ONO gate structure and the source region is different from a lateral distance between the ONO gate structure and the drain region, and the ONO gate structure comprises:
a bottom oxide layer;
a top oxide layer;
a gate control layer located on the top oxide layer; and
a nitride layer located between the bottom oxide layer and the top oxide layer, wherein the top oxide layer of the ONO gate structure is configured to be stressed only during an erase operation; and
a spacer disposed on at least one of a sidewall of the top oxide layer, a sidewall of the bottom oxide layer, and a sidewall of the nitride layer; and
a plurality of word lines electrically connected to the memory units, wherein each of the word lines is disposed on a sidewall of the spacer of a respective one of the memory units;
wherein the bottom oxide layer is located closer to the semiconductor substrate than the top oxide layer, and the bottom oxide layer has a first thickness, and the top oxide layer has a second thickness smaller than the first thickness.

10. The memory device of claim 9, wherein the nitride layer is formed from silicon nitride.

11. The memory device of claim 9, wherein the top oxide layer and the bottom oxide layer are formed from silicon oxide.

12. The memory device of claim 9, wherein the first thickness of the bottom oxide layer is 2-7 times of the second thickness of the top oxide layer.

13. The memory device of claim 9, wherein the first thickness of the bottom oxide layer is in a range from about 30 angstroms to about 100 angstroms, and the second thickness of the top oxide layer is in a range from about 15 angstroms to about 50 angstroms.

14. The memory device of claim 9, wherein a thickness of the nitride layer is in a range from about 70 angstroms to about 150 angstroms.

15. The memory device of claim 9, wherein the drain region is coupled to a corresponding bit line.

16. The memory device of claim 9, wherein each of the memory units are formed in a split-gate structure.

17. An operation method of a memory device, the operation method comprising:
providing the memory device including at least one memory unit, wherein the at least one memory unit comprises a semiconductor substrate, a source region, a drain region, a spacer, a word line, and an ONO gate structure, and the ONO gate structure comprises:
a bottom oxide layer;
a top oxide layer; and
a nitride layer located between the bottom oxide layer and the top oxide layer, wherein the bottom oxide layer is located closer to the semiconductor substrate than the top oxide layer, and the bottom oxide layer has a first thickness, and the top oxide layer has a second thickness smaller than the first thickness, the spacer being disposed on at least one of a sidewall of the top oxide layer, a sidewall of the bottom oxide layer, and a sidewall of the nitride layer, the word line being disposed on a sidewall of the spacer;
conducting an erasing operation to erase data stored in the at least one memory unit, wherein the erasing operation comprises applying a voltage difference to the ONO gate structure, and a voltage at the bottom oxide layer is lower than a voltage at the top oxide layer, wherein the top oxide layer of the ONO gate structure is stressed only during the erasing operation; and
conducting a programming operation to program the at least one memory unit, wherein the programming operation comprises applying another voltage difference to the ONO gate structure, and a voltage at the bottom oxide layer is lower than a voltage at the top oxide layer.

18. The operation method of claim 17, wherein the erasing operation is conducted by using a Fowler-Nordheim (FN) erase method.

19. The operation method of claim 17, wherein the programming operation is conducted by using a source side injection (SSI) method.

20. The memory device of claim 9, further comprises a plurality of isolation structures disposed in the semiconductor substrate.

* * * * *